United States Patent [19]
Lehan et al.

[11] Patent Number: 5,814,195
[45] Date of Patent: *Sep. 29, 1998

[54] SPUTTERING SYSTEM USING CYLINDRICAL ROTATING MAGNETRON ELECTRICALLY POWERED USING ALTERNATING CURRENT

[75] Inventors: John Lehan, Benicia; Henry Byorum, Sunnyvale; Russell J. Hill, El Cerrito; J. Kirkwood Rough, San Jose, all of Calif.

[73] Assignee: The Boc Group, Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 736,978

[22] Filed: Oct. 25, 1996

Related U.S. Application Data

[63] Continuation of Ser. No. 428,896, Apr. 25, 1995, abandoned.

[51] Int. Cl.$^6$ ..................................... C23C 14/34
[52] U.S. Cl. ................. 204/192.12; 204/298.08; 204/298.21; 204/298.22
[58] Field of Search ............... 204/192.12, 298.08, 204/298.21, 298.22, 192.13

[56] References Cited

U.S. PATENT DOCUMENTS

| | | | |
|---|---|---|---|
| 3,617,459 | 11/1971 | Logan | 204/298.08 X |
| 3,767,551 | 10/1973 | Lang, Jr. et al. | 204/298.08 X |
| 4,046,659 | 9/1977 | Cormia et al. | |
| 4,356,073 | 10/1982 | McKelvey | |
| 4,434,038 | 2/1984 | Morrison, Jr. | |
| 5,047,131 | 9/1991 | Wolfe et al. | |
| 5,082,546 | 1/1992 | Szczyrbowski et al. | |
| 5,096,562 | 3/1992 | Boozenny et al. | |
| 5,108,574 | 4/1992 | Kirs et al. | 204/298.21 X |
| 5,169,509 | 12/1992 | Latz et al. | |
| 5,338,422 | 8/1994 | Belkind et al. | 204/298.21 X |
| 5,399,252 | 3/1995 | Scherer et al. | 204/298.08 X |

FOREIGN PATENT DOCUMENTS

| | | |
|---|---|---|
| 0 546 293 A1 | 10/1992 | European Pat. Off. |
| 0 701 270 A1 | 9/1995 | European Pat. Off. |
| 2-258976 | 10/1990 | Japan ........... 204/298.08 |

OTHER PUBLICATIONS

Steidel, C.A. et al.; "Compositional Control of Tantalum–Aluminum Alloy Films by a dc Biased, ac Sputtering Technique"; *The Journal of Vacuum Science and Technology*; vol. 9, No. 1; pp. 346–349.

Kumagai, H.Y.; "A New AC Sputtering Technique for the Deposition of Thin Films"; *I.E.E.E. Transactions on Parts, Hybrids, and Packaging*; vol. PHP–89, No. 3; Sep. 1972; pp. 7–10.

Este, G. and W.D. Westwood; "A quasi–direct–current sputtering technique for the deposition of dielectrics at enhanced rates"; *J. Vac. Sci. Technol. A*; vol. 6, No. 3; May/Jun. 1988; pp. 1845–1848.

Scherer, M. et al.; "Reactive alternating current magnetron sputtering of dielectric layers"; *J. Vac. Sci. Technol. A*; 10(4); Jul/Aug. 1992; pp. 1772–1776.

James, A.S. and A. Matthews; "Calculation of ion energy distributions in low frequency r.f. glow discharges"; *Surface and Coatings Technology*; 59; 1993; pp. 86–90.

*Primary Examiner*—Nam Nguyen
*Attorney, Agent, or Firm*—David A. Draegert; Salvatore P. Pace

[57] ABSTRACT

A sputtering system using an AC power supply in the range of 10 kHz to 100 kHz uses two rotatable cylindrical magnetrons. The rotatable cylindrical magnetrons, when used for depositing a dielectric layer onto a substrate, clean off dielectric material that is deposited onto the target. This prevents a dielectric layer on the target from acting like a capacitor and may help avoid arcing. Additionally, an impedance-limiting capacitor can be placed in series in the electrical path between the targets through the transformer so as to reduce arcing. This impedance-limiting capacitor has a value much larger than the capacitors used to couple the power supply to a target in radio frequency sputtering systems.

24 Claims, 4 Drawing Sheets

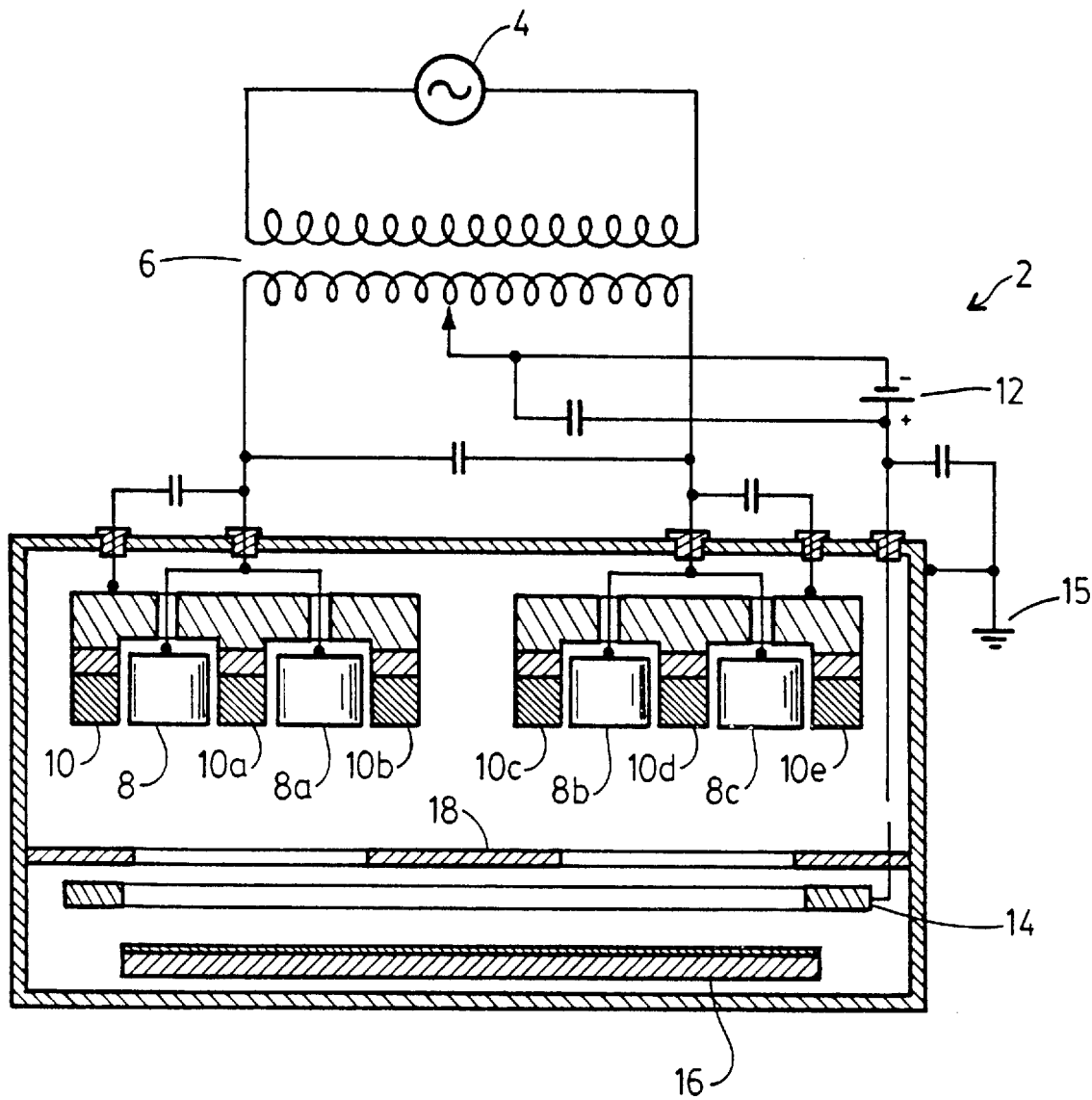
FIG._1.
(BACKGROUND ART)

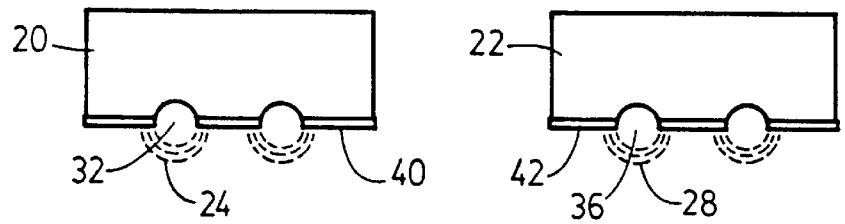
FIG._2.
(BACKGROUND ART)
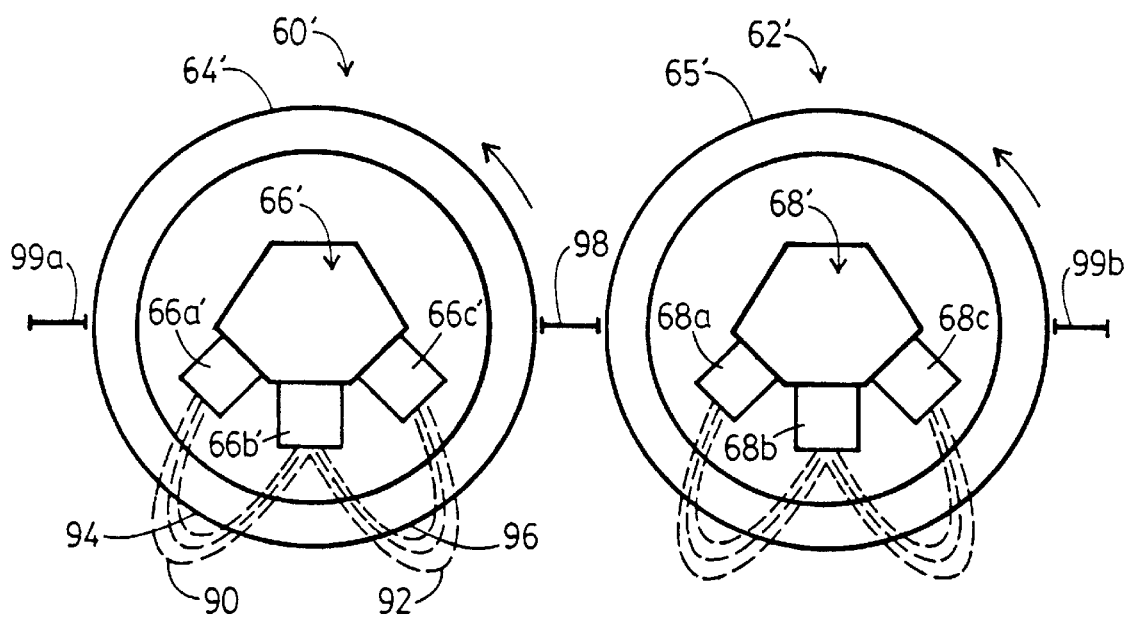
FIG._4.

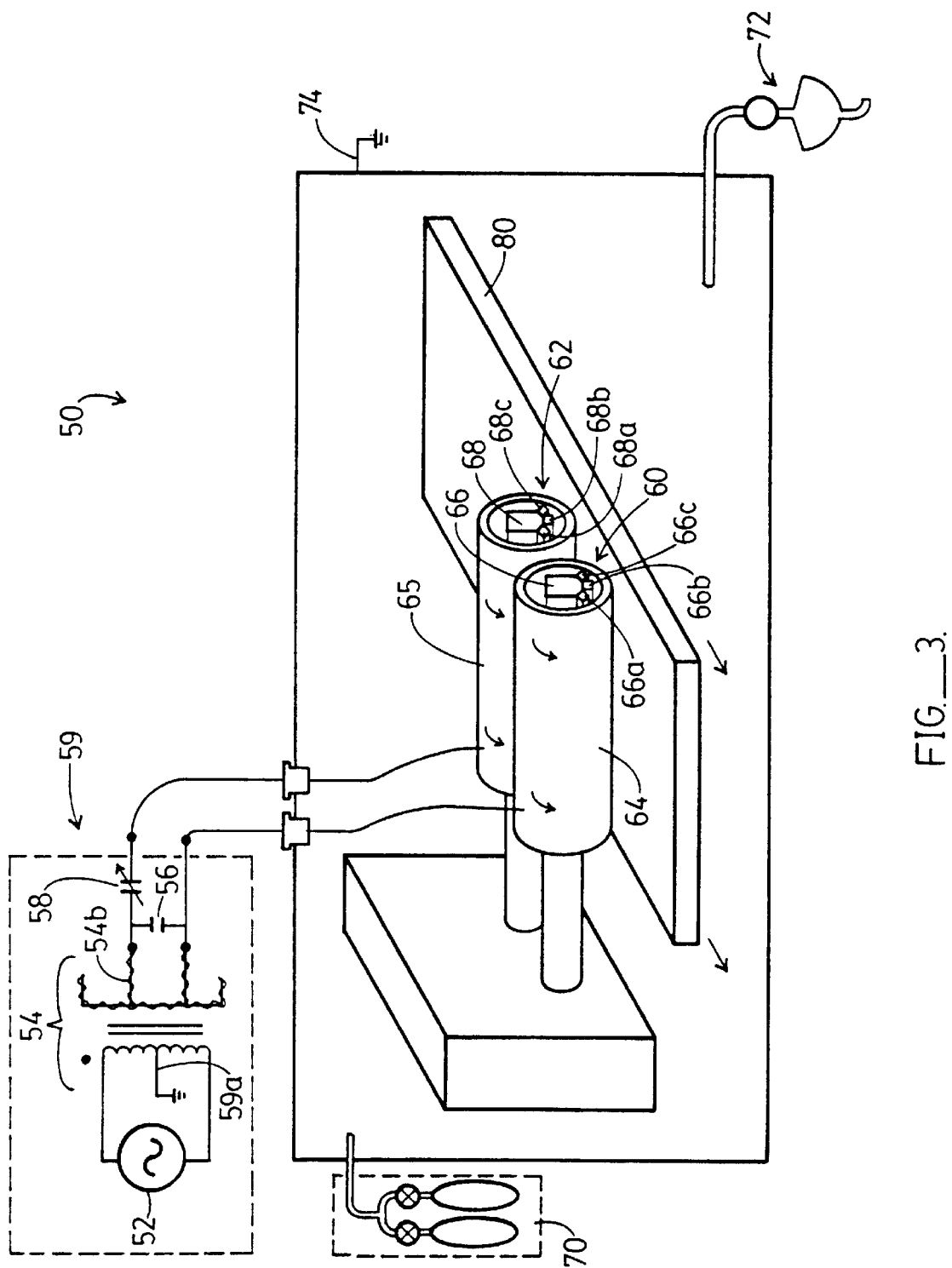
FIG._3.

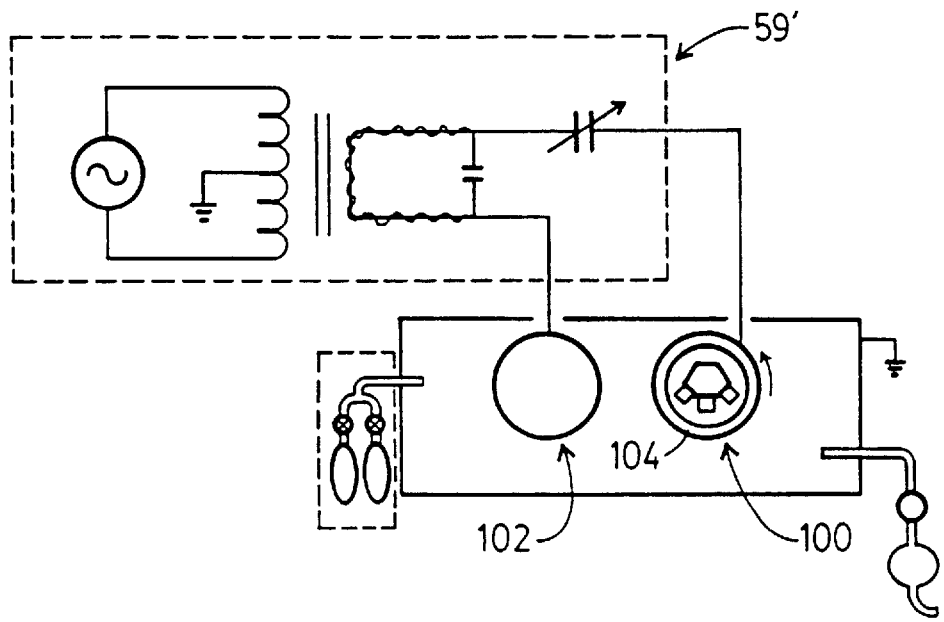
FIG._5.
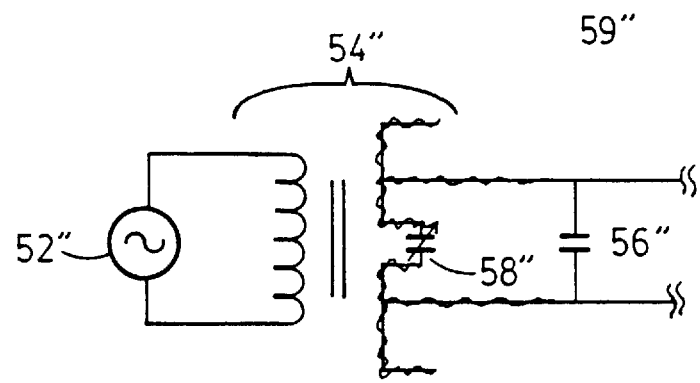
FIG._6.

SPUTTERING SYSTEM USING CYLINDRICAL ROTATING MAGNETRON ELECTRICALLY POWERED USING ALTERNATING CURRENT

This is a continuation of application Ser. No. 08/428,896 filed Apr. 25, 1995 now abandoned.

BACKGROUND OF THE INVENTION

The present invention relates to a sputtering system used to form thin film layers on glass. In particular, the system relates to a sputtering system which is used to produce electrically insulative dielectric layers.

Sputtering systems with alternating current (AC) power sources often are used to form electrically insulative dielectric layers on a substrate. One such system is disclosed in Szczyrbowski, et al. U.S. Pat. No. 5,082,546. FIG. 1 is a diagram of the AC-powered sputtering system 2 of Szczyrbowski, et al. This sputtering system 2 uses an AC power supply 4 connected by transformer 6 to targets 8, 8a, 8b and 8c. The system uses magnets 10, 10a, 10b, 10c, 10d and 10e to confine the plasma formed in the sputtering chamber 2.

Note that an additional direct current (DC) power supply 12 is used to maintain the anode 14 at a voltage above system ground 15. The additional DC power supply 12 is used in an attempt to avoid arcing in the sputtering system. The required DC power supply is expensive and may complicate the sputtering system design.

Additionally, the use of the anode 14 has a disadvantage in that the anode may become partially coated with the dielectric materials sputtered by the system despite the use of baffles 18. Since the electrons in the plasma will not be as strongly attracted to the coated portions of the anode 14, the ions of the plasma will generally avoid that area as well due to the requirement of quasi-neutrality in the plasma. The scarcity of ions around the coated portions may produce an uneven deposition of the dielectric material onto the substrate 16.

FIG. 2 is a cross-sectional view of two targets 20 and 22 used in a background art AC power supply sputtering system. During the operation of the sputtering system shown in FIG. 2, magnets (not shown) partially contain the plasma in the magnetic fields 24 and 28 such that racetrack-shaped erosion zones 32 and 36 are formed. The erosion of the target material 20 and 22 results from ions in the plasma hitting the target and causing atoms from the target to sputter off. The re-deposition of the sputtered dielectric material on the targets 20 and 22 forms layers 40 and 42. These layers cover most of the sections of the targets 20 and 22, except for the racetrack-shaped erosion areas 32 and 36. When the targets 20 and 22 are connected to an AC power supply, the targets alternately act as the cathode and the anode. When an electrode such as target 20 acts as the anode, it attracts electrons in the plasma. In this situation, the magnetic fields 24 and 28 may impede the flow of electrons reaching the erosion areas, resulting in a high plasma impedance. The dielectric layer will prevent electrons from passing through to the target, and charge will be stored on the dielectric film 40. In this manner, the dielectric film 40 acts as a capacitive element. Although the switching between the positive and negative portions of the AC power supply can help to discharge the stored charge in this background art system, the system still may arc. Additionally, the capacitance caused by the dielectric film 40 may be undesirable as it changes in time.

It is an object of the present invention to produce an improved sputtering system that uses AC power which avoids the problems of the prior art.

SUMMARY OF THE INVENTION

An advantage of the present improved sputtering system involves the use of a rotatable cylindrical magnetron with an AC power supply. The rotatable cylindrical magnetrons use cylindrical rotating targets. When the target acts as the cathode, the deposited dielectric material is cleaned off of a portion of the target in the erosion zone. As the target rotates, different areas of the target serve as the erosion zone so the whole target is cleaned. The cleaned portions of the target provide a path for the electrons to enter the target when the target acts as the anode. Since the dielectric material is cleared from the cylindrical magnetron, the target will not act as a capacitor and store charge, but will act as a resistive element. The use of rotatable cylindrical targets in the cylindrical magnetron helps avoid arcing, because charge is not stored on deposited dielectric layers of the target.

Additionally, a benefit of the present invention is the use of an impedance-limiting capacitor. This impedance-limiting capacitor is preferably used along with the AC power supply with frequencies in the 10 kHz–100 kHz range. This 10 kHz–100 kHz range is lower than the frequency range used with radio frequency sputtering systems which have a capacitor to impedance match the system. The impedance-limiting capacitor is preferably placed in a secondary conductive path of the transformer. The impedance-limiting capacitor helps prevent arcing in the system. The impedance-limiting capacitor should have a relatively large capacitance value. The capacitance is preferably in the range of 0.2 to 10 $\mu$F. The capacitance values in this range are much larger than the values of capacitors used to couple the electrodes with the higher frequency (megahertz to tens of megahertz) power supplies in RF sputtering systems. The capacitors used in radio frequency systems are typically about 10 to 100 picofarads.

The AC power supply has a frequency range which is high enough to avoid extinguishing the plasma between the reversal of the positive and negative portions of the signal, and is low enough so that the ions can follow the instantaneous electric field. A signal of 10 kHz or greater is sufficient such that the recombination time of the plasma is greater than the time between the positive and the negative portions of the power supply, so that the plasma does not extinguish. The recombination time is typically determined by the distances between the targets and walls in the chamber.

An additional advantage of the present invention is that no extra DC voltage supply is required. The DC voltage supplies used in other sputtering systems complicate the design of the sputtering system and are expensive. The present invention also does not use an electrically permanent anode in the design. Permanent anodes in sputtering systems can get coated with dielectric material and cause the deposition profile onto the substrate to be distorted.

BRIEF DESCRIPTION OF THE DRAWINGS

The above and other features and aspects of the present invention will become more apparent upon reading the following detailed description in conjunction with the accompanying drawings, in which:

FIG. 1 is a schematic diagram of a background art sputtering system using an AC power supply;

FIG. 2 is a cross-sectional view of two targets used in a background art sputtering system with an AC power supply;

FIG. 3 is a schematic diagram of the sputtering system of the present invention;

FIG. 4 is a cross-sectional view of the cylindrical magnetrons used with the invention shown in FIG. 3;

FIG. 5 is a schematic diagram of an alternate embodiment of the present invention; and FIG. 6 is a schematic diagram showing an impedance-limiting capacitor positioned in the secondary winding of the transformer.

DETAILED DESCRIPTION OF THE PREFERRED EMBODIMENT

FIG. 3 is a schematic diagram of the sputtering system 50 using an AC power supply 52. For the reasons discussed above, the AC power supply 52 preferably produces a power signal with a frequency in the range of 10 kHz to 100 kHz. In a preferred embodiment, the frequency of the AC power supply 52 is about 50 kHz. Note that the frequency of the power supply 52 is less than the radio frequency range, so that reflected power is not an important concern. The AC power supply 52 is available from Halmar Robicon, ENI, Princeton Applied Research, or Advanced Energy. The AC power supply 52 is connected to transformer 54. Transformer 54 has a bifilar-wound secondary 54b that prevents the secondary 54b from becoming an autotransformer. Transformer 54 may also have a grounded center tap 54a for safety. The secondary of transformer 54 preferably has multiple taps that provide the function of impedance matching for the system. Transformer 54 is connected to a shunt capacitor 56. Shunt capacitor 56 helps start the plasma if it extinguishes and reduces high-frequency noise. A typical value for shunt capacitor 56 is about 0.3 microfarad.

The impedance-limiting capacitor 58 is preferably connected in series in the electrical path that goes between the two targets through the transformer. In a preferred embodiment shown in FIG. 6, the impedance-limiting capacitor 58" is positioned in the secondary winding of transformer 54".

Looking again at FIG. 3, as discussed above, the capacitance of the impedance-limiting capacitor 58 prevents arcing in the sputtering system. The impedance-limiting capacitor 58 limits the amount of current that can flow between the targets in case of a short. Impedance-limiting capacitor 58 is preferably a large, variable capacitor. Capacitance values for the impedance-limiting capacitor should be in the range of about 0.2 to 10 $\mu$F. Since the frequencies of the AC power supply 52 are significantly lower than the radio frequency power supplies, reflected power is not a problem, and therefore the capacitance 58 is not required to avoid reflected power. The function of impedance matching is accomplished with the multiple taps on the secondary of the transformer as discussed above.

The AC power from the circuitry 59 is connected to the cylindrical magnetrons 60 and 62. Cylindrical magnetrons are described in Wolfe et al. U.S. Pat. No. 5,047,137 and McKelvey U.S. Pat. No. 4,356,073, both of which are incorporated herein by reference. The cylindrical magnetrons are available from The BOC Group, Inc., Airco Coating Technology Division, located in Concord, Calif. under the name C-MAG™. The rotatable cylindrical magnetrons 60 and 62 use rotatable cylindrical tubular targets 64 and 65. The cylindrical rotatable tubular targets 64 and 65 preferably comprise an outer layer with a coat of a metallic or semiconductor material. The semiconductor material layer is preferably doped so that the layer is more conductive. Silicon is commonly used as the sputtered material in cylindrical magnetron systems. The silicon can be reactively sputtered to produce silicon dioxide or silicon nitride layers on the substrate 80. Other typical dielectric materials used include $TiO_2$, $SnO_2$, $Nb_2O_5$, and $Al_2O_3$.

The rotatable cylindrical magnetron includes magnet assemblies 66 and 68. These magnet assemblies use magnets 66a, 66b and 66c as well as 68a, 68b and 68c. Since the magnet assemblies have three poles, they produce two parallel containment areas. These containment areas form erosion zones when the target is acting as the cathode.

The action of the targets 60 and 62 can be better shown with respect to FIG. 4. FIG. 4 shows a cross-sectional view of two cylindrical magnetrons 60' and 62'. Cylindrical rotatable tubular targets 64' and 65' are connected to the AC power supply shown in FIG. 3, so that the targets 64' and 65' alternate between being the cathode (negative polarity) and anode (positive polarity) of the system.

The magnet assembly 66' produces magnetic fields 90 and 92. The magnetic fields 90 and 92 contain the electrons in the plasma when the magnetron 60' is acting as the cathode so that the ions formed by the collisions with the trapped electrons sputter off the target material 64' in the erosion areas 94 and 96. In reactive sputtering, the reactive ions combine with the sputtering material either at the target, the substrate or in the chamber atmosphere. The ions also remove the dielectric material that has been redeposited onto the surface of the cylindrical tubular target 64' outside the two erosion zones 94, 96. When the polarity of the power signal to the target 64' is reversed, the target acts as an anode and attracts electrons. Because of the rotation of the cylindrical tubular targets 64' and 65', the portions of the targets 64' and 65' which were eroded by the ions when the target acts as the cathode are rotated into different positions away from the magnetic fields, such as magnetic fields 94 and 96. As the cylindrical tubular target rotates, these cleaned areas allow for the electrons to make electrical contact with areas of the target away from the magnetic field. Additionally, since the targets 64' and 65' are cylindrical, there is more area available for the electrons to contact the targets 64' or 65' than in planar magnetron systems. This lowers the system impedance.

In the system of the present invention, the targets 64' or 65' do not store charge since the dielectric material has been eroded away. For this reason, there is not as large a capacitance when the system is operating. Additionally, since charge is not stored onto a dielectric material layer, the system of the present invention is not likely to arc as a result of the dielectric breakdown. This present sputtering system is different from the prior art AC sputtering systems shown with respect to FIG. 2, since the dielectric layer 40 or 42 is deposited on top of target material and acts as a capacitive element in this prior art system.

Looking again at FIG. 4, in the preferred embodiment, the distance between the cylindrical targets 98 is about 1–3 inches, and the distance between the cylindrical targets in the wall 99a and 99b is about four or more inches. These distances will ensure that the recombination time for the plasma is shorter than the time between positive and negative portions of the power supply for a 10 KHz minimum frequency signal. The arrangement of cylindrical magnetrons makes the plasma relatively unaffected by the arrangement of the chamber walls, since the discharge is maintained between the targets.

Looking again at FIG. 3, a gas supply 70 and pump 72 are used to supply the gases at the required pressures for the sputtering deposition. Typical gases include oxygen, nitrogen, and noble gases. Typical gas pressures are 1–5 mTorr. The cathodes and power supply are electrically isolated from the chamber. This may be done by grounding the chamber at location 74. The substrate 80 is coated by the sputtered dielectric material. This substrate 80 moves underneath the targets. The line speed of the substrate 80, among other factors, determines the deposition thickness of the dielectric layer onto the substrate 80.

FIG. 5 is a schematic diagram of an alternate embodiment of the present invention. In this alternate embodiment, only a single cylindrical magnetron 100 is used. The other cylindrical magnetron is replaced by an electrically conductive element 102. This electrically conductive element is connected to the circuitry 59' to supply the AC power supply to the cylindrical magnetron and electrically conductive element. It is preferred that the surface area of the electrically conductive material 106 is equivalent to that of the cylindrically rotatable target 104 on the cylindrical magnetron 100, so that neither the cylindrically rotatable magnetron 100 nor the electrically conductive material 102 maintains a DC bias voltage.

Various details of the implementation and method are merely illustrative of the invention. It will be understood that various changes in such details may be within the scope of the invention, which is to be limited only by the appended claims.

What is claimed is:

1. A sputtering system for forming a dielectric layer on a substrate comprising:
    an alternating current power supply having a first and a second pole that alternate in polarity;
    a chamber;
    a rotatable magnetron in said chamber, said rotatable magnetron including a cylindrical tubular target of electrically conductive material responsive to the power signal at the first pole of the alternating current power supply and a magnet assembly adapted to direct the plasma to form an erosion zone on the cylindrical tubular target, the erosion zone being the area sputtered when the negative portion of the power supply is supplied to the cylindrical tubular target, wherein the cylindrical tubular target is adapted to rotate such that the erosion zone is located at different parts of the cylindrical target as the cylindrical target rotates and so that the sputtering of the target removes some dielectric material deposited onto the target to form a cleaned portion of the target and wherein the removal of the dielectric from the cleaned portion of the target in portions away from the erosion zone reduces the impedance of the target as seen by the electrodes in the plasma when the positive portion of the power supply is supplied to the cylindrical tubular target and thus may prevent arcing, and
    an electrically conductive member in the chamber responsive to the power signal at the second pole of the alternating current supply.

2. The system of claim 1, wherein the electrically conductive member has a similar surface area as the cylindrical tubular target.

3. The system of claim 1, wherein the electrically conductive member comprises a second cylindrical magnetron connected to the second pole, said second cylindrical magnetron acting as an anode while the cylindrical magnetron connected to the first pole acts as a cathode and the second cylindrical magnetron acting as a cathode while the cylindrical magnetron connected to the first pole acts as an anode.

4. The system of claim 1, wherein the arrangement of cylindrical magnetron and the electrically conductive member makes plasma relatively unaffected by the arrangement of the chamber walls.

5. The system of claim 1, wherein the alternating current power supply produces a power signal with a high enough frequency such that the plasma does not extinguish between the positive and negative portions of the signal and the power signal has a low enough frequency so that the ions and electrons can both follow the instantaneous power signal.

6. The system of claim 5, wherein the power supply signal supplied by the alternating current power supply is between 10 kHz and 100 kHz.

7. The system of claim 5, wherein the alternating current power supply is connected to the cylindrical tubular target and the electrically conductive member through a transformer and an impedance-limiting capacitor connected in series in the electrical path between the target and the electrically conductive member through the transformer, the capacitance of the impedance-limiting capacitor being greater than about 0.2 $\mu F$.

8. The system of claim 1, wherein no direct current power supply is connected to an electrode of the system.

9. A sputtering system for forming a dielectric layer on a substrate comprising:
    an alternating current power supply having a first and a second pole and adapted to produce a power signal with a frequency of less than a megahertz;
    a chamber;
    a transformer having two output terminals and two input terminals, the two input terminals connected between the first and second pole;
    a cylindrical tubular target of an electrically conductive material with associated magnet assembly located in said chamber electrically connected by a first electrical path to the first output terminal of the transformer;
    an electrically conductive member in the chamber electrically connected by a second electrical path to the second output terminal of the transformer; and
    an impedance-limiting capacitor connected in series in the electrical path between the target and the electrically conductive member through the transformer, the capacitance of the impedance-limiting capacitor being sufficiently large that the impedance-limiting capacitor prevents arcing in the system.

10. The system of claim 9, wherein the electrically conductive member comprises a second rotatable cylindrical tubular target with a second magnet assembly.

11. The system of claim 9, further comprising a shunt capacitor electrically connected between first and second output terminals of the transformer.

12. The system of claim 9, wherein the electrically conductive member has a similar surface area as the target.

13. The system of claim 9, wherein the arrangement of the target and the electrically conductive member makes the plasma relatively unaffected by the arrangement of the chamber walls.

14. The system of claim 9, wherein the alternating current power supply produces a power signal that has a frequency sufficiently high that the plasma does not extinguish between the positive and negative portions of the signal and sufficiently low the ions and electrons can both follow instantaneous electric fields produced by the power signal.

15. The system of claim 9, wherein the alternating current power supply produces a power signal with a frequency of between 10 kHz and 100 kHz.

16. The system of claim 9, wherein the impedance-limiting capacitor is a variable capacitor.

17. The system of claim 9, wherein the impedance-limiting capacitor has a capacitance value in the range of 0.2 to 10 $\mu$F.

18. The system of claim 9, wherein the impedance limiting capacitor is positioned in a secondary conductive path of the transformer.

19. The system of claim 9, wherein the transformer has additional windings and output terminals to impedance match the system.

20. A method for depositing a dielectric layer on a substrate by reactive sputtering comprising the steps of:

providing a cylindrical target of a conductive material in a chamber;

applying an alternating current signal to the cylindrical target to produce a plasma, said signal having positive and negative portions;

producing a magnetic field to produce an erosion zone about the cylindrical target such that ions strike the erosion zone when a negative portion of the signal is applied to the cylindrical target;

providing in the chamber a gas which reacts with the target material to form a dielectric;

depositing a dielectric layer on the substrate;

cleaning portions of the target by rotating the cylindrical target so that portions of the cylindrical target away from the erosion zone defined by the magnetic field have deposited material removed by the bombarding ions of the erosion zone; and attracting electrons in the plasma to the cleaned portions away from the erosion zone when the positive portion of the signal is applied to the target.

21. The method of claim 20, further comprising providing an additional cylindrical target connected to receive an alternating current signal such that each target is negative when the other target is positive.

22. The system of claim 10 wherein the alternating current power supply produces a power signal with a frequency of between 10 kHz and 100 kHz, and wherein the impedance-limiting capacitor has a capacitance value in the range of 0.2 to 10 $\mu$F.

23. The method of claim 21 wherein the alternating current signal has a frequency in the range of between 10 kHz and 100 kHz.

24. The method of claim 23 wherein the frequency is about 50 kHz.

* * * * *